United States Patent
Habing et al.

(10) Patent No.: US 6,246,582 B1
(45) Date of Patent: *Jun. 12, 2001

(54) INTERCHANGEABLE STIFFENING FRAME WITH EXTENDED WIDTH WEDGELOCK FOR USE IN A CIRCUIT CARD MODULE

(75) Inventors: Robert D. Habing; Thomas Allan Odegard, both of Albuquerque, NM (US)

(73) Assignee: Honeywell Inc., Morristown, NJ (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/223,288

(22) Filed: Dec. 30, 1998

(51) Int. Cl.$^7$ ..................................... H05K 7/20
(52) U.S. Cl. .................. 361/704; 257/727; 361/719; 403/409.1
(58) Field of Search ............... 403/409.1; 165/80.3, 165/185; 211/41.17; 254/104; 257/726, 727; 361/704, 707, 711, 715, 719, 720, 801

(56) References Cited

U.S. PATENT DOCUMENTS

| 4,298,904 | 11/1981 | Koenig | 361/386 |
|---|---|---|---|
| 4,558,395 | 12/1985 | Yamada et al. | 361/385 |
| 4,716,498 | 12/1987 | Ellis | 361/386 |
| 4,751,963 | * 6/1988 | Bui . | |
| 4,777,561 | 10/1988 | Murphy et al. | 361/381 |
| 4,853,829 | 8/1989 | Buzzelli | 361/386 |
| 4,879,634 | * 11/1989 | Storrow . | |
| 4,916,575 | 4/1990 | Van Asten | 361/386 |
| 4,971,570 | 11/1990 | Tolle et al. | 439/327 |
| 4,994,937 | 2/1991 | Morrison | 361/386 |
| 5,225,964 | 7/1993 | Nemes | 361/386 |
| 5,253,963 | 10/1993 | Ries | 411/75 |
| 5,262,587 | 11/1993 | Moser | 174/15.1 |
| 5,280,411 | 1/1994 | Dirks et al. | 174/15.1 |
| 5,371,653 | 12/1994 | Kametani et al. | 361/721 |
| 5,414,592 | * 5/1995 | Stout . | |

(List continued on next page.)

Primary Examiner—Gerald Tolin
(74) Attorney, Agent, or Firm—Loria B. Yeadon; Andrew A. Abeyta

(57) ABSTRACT

A circuit card module having increased cooling efficiency which comprises at least one printed wiring board (PWB), at least one component mounted on the PWB, a heatsink, an interchangeable frame, and a wedgelock for use with a chassis cold wall. One embodiment of the interchangeable frame comprises a protrusion so that it can be used with a convection-cooled chassis (fully compliant with IEEE 1101.2 Specifications). Another embodiment, for use with conduction-cooled chassis only (partially compliant with IEEE 1101.2 Specifications), is maximally efficient in removing heat as it does not include the protrusion. In the embodiment without the protrusion, the conduction contact area between the chassis cold wall and the frame is increased in width from approximately 0.25" to approximately 0.35". In either embodiment, the wedgelock is mounted to one surface of the frame such that when installed in a conduction-cooled chassis, the opposite frame surface is forced against the chassis cold wall. In addition, the wedgelock can be enlarged to increase the clamping force over the contact area. The increased wedgelock size approximately doubles the clamping force applied. The net effect of these improvements are a reduction in the thermal resistance per inch of wedgelock length. This, in turn, reduces the module to chassis interface temperature rise of an exemplary 40 W module from 8.3° C. to 4.15° C. The improved thermal resistances and decreased temperature rises boost the reliability of the circuit cards, particularly in the stringent environments experienced in military applications.

5 Claims, 6 Drawing Sheets

U.S. PATENT DOCUMENTS

| | | | |
|---|---|---|---|
| 5,482,109 | 1/1996 | Kunkel | 165/80.3 |
| 5,485,353 * | 1/1996 | Hayes . | |
| 5,532,430 | 7/1996 | Lanoe | 165/80.3 |
| 5,549,155 | 8/1996 | Meyer, IV et al. | 165/104.33 |
| 5,559,675 | 9/1996 | Hsieh et al. | 361/707 |
| 5,625,227 | 4/1997 | Estes et al. | 257/712 |
| 5,714,789 | 2/1998 | Estes et al. | 257/414 |
| 5,859,764 * | 1/1999 | Davis . | |
| 5,892,658 * | 4/1999 | Urda . | |

* cited by examiner

INTERCHANGEABLE STIFFENING FRAME WITH EXTENDED WIDTH WEDGELOCK FOR USE IN A CIRCUIT CARD MODULE

SEQUENCE LISTING (SEE 37 C.F.R. §§1.821 THROUGH 1.825)

Not Applicable.

I. CROSS-REFERENCE TO RELATED APPLICATIONS

This application is related to co-pending application, filed on even date herewith, entitled "Adapter Kit to Allow Extended Width Wedgelock for Use in a Circuit Card Module."

II. BACKGROUND OF THE INVENTION

The present invention pertains generally to the field of computer card modules and the frames contained within the modules. More specifically, the present invention relates generally to circuit card modules having frames that improve the cooling properties of the modules but optionally remain compliant with Institute of Electrical and Electronics Engineers (IEEE) specifications.

Commercially-available, off-the-shelf components that are included in circuit card modules are often unreliable when exposed to the high temperatures present in, for example, the military environment. This is due to the ineffectiveness of conventional methods of controlling component junction temperatures under stringent temperature conditions. Conventional cooling methods utilized in off-the-shelf parts include normal convection, forced convection—such as fan cooling, liquid cooling, various forms of heat conductors or sinks, etc.—and combinations of two or more of these methods. Numerous patents have issued to structural designs having cooling properties for use with circuit card modules. For example, U.S. Pat. No. 5,280,411, issued to Dirks et al. discloses the addition of heat conducting rails to the edges of a circuit card. Meyer, IV et al., in U.S. Pat. No. 5,549,155, teaches the use of a heat conductive p and a heat pipe to disperse the unwanted heat from a computer chip. U.S. Pat. Nos. 5,532,430 and 5,559,675, of Lanoe and Hsieh et al., respectively, disclose heat dissipating structures for use with circuit cards. In U.S. Pat. No. 4,916,575, Van Asten discusses the use of a ribbed frame, which is structured to hold multiple cards. Several patents, including U.S. Pat. Nos. 4,558,395; 5,482,109; 5,714,789; and 5,625,227, disclose the use of a circulating coolant system to remove the generated heat. However, none of these patents disclose or suggest a structure that satisfies the IEEE 1101.2 standards (i.e., IEEE Standard for Mechanical Core Specifications for Conduction-Cooled Eurocards), which specifies convection-cooled chassis requirements and conduction-cooled chassis requirements.

The prior art has also recognized the utility of additional force at the contact points between module structures and the computer chassis. Morrison, U.S. Pat. No. 4,994,937, and Moser, U.S. Pat. No. 5,262,587, teach clamping structures to achieve this goal. Buzzelli, in U.S. Pat. No. 4,853,829, discloses a locking mechanism having a sliding block which holds the module to the heatsink plate. As mentioned above, none of these references appear to satisfy the IEEE standards of current interest.

The current methods for cooling commercial off-the-shelf circuit cards, such as Versa Module Eurocards (VMEs), are conduction-cooled modules that operate in a conduction-cooled chassis or a convection-cooled chassis, such as described in IEEE 1101.2 Specifications. In order to comply with the IEEE 1101.2 Specifications, the cards must be mechanically compliant with both chassis types. This requires an approximately 0.063" thick×0.098" wide protrusion along the card edge to engage the convection-cooled chassis card guides. This protrusion is often an extension of the printed wiring board (PWB) or machined as part of PWB. A challenge posed by the IEEE 1101.2 Specifications is that the card modules must be compatible with existing forced-air cooled chassis or racks, which do not use wedge-locks for heat exchange or mechanical mounting. Instead, the existing forced-air cooled chassis use the edge of the PWB as a guide and one of the mechanical attachment points for the chassis. In the convection-cooled configuration, air flow over the card is used to remove component heat. In the conduction-cooled configuration, the component heat is removed by conduction to the chassis cold wall. The heat is then removed from the chassis by external means. The protrusion reduces the efficiency of heat removal by reducing the available conduction contact area and by reducing the size of the wedgelock that can be used. These two effects reduce the efficiency of movement of the heat to the cold wall of the chassis. Because of these legacy requirements, the conduction-cooled modules do not take full advantage of the area available at the cold wall of the chassis.

Accordingly, it is an object of the present invention to provide a circuit card module with improved cooling efficiency that has a stiffening frame for the circuit cards and a mounting structure to allow it to be optionally compliant with the IEEE 1101.2 chassis structure.

It is a further object of the present invention to improve the cooling efficiency of the circuit card module by developing a frame structure which provides a more direct path for the dissipation of heat from the components of the circuit card.

It is another object of the present invention to increase the conduction contact area between the circuit card module and the chassis.

It is still a further object of the present invention to improve the cooling efficiency of the module through the use of a larger wedgelock.

It is yet a further object of the present invention to make the frame/wedgelock assembly interchangeable with a conventional frame so that the module can be used with either conduction-cooled chassis or convection-cooled chassis.

III. BRIEF SUMMARY OF THE INVENTION

The following summary of the invention is provided to facilitate an understanding of some of the innovative features unique to the present invention, and is not intended to be a full description. A full appreciation of the various aspects of the invention can only be gained by taking the entire specification, claims, drawings, and abstract as a whole.

The present invention is a circuit card module that is adapted for use in either a conduction-cooled or a convection-cooled chassis. In the conduction-cooled embodiments, the present invention results in increased cooling efficiency. The circuit card module comprises one or more printed wiring boards (PWB), at least one component mounted on the PWB, a heatsink that creates a heat path from the component to the chassis, an interchangeable frame that can be used in either the conduction-cooled or convection-cooled chassis, and a wedgelock for securing the frame to the conduction-cooled chassis. One embodiment of the interchangeable frame can comprise a protrusion (or guide rib) so that it can be used with a convection-cooled chassis or a conduction-cooled chassis and comply with the IEEE 1101.2 Specifications. Another embodiment, for use only with a conduction-cooled chassis, is maximally efficient in removing heat as it does not include the protrusion. In the configuration without the protrusion, the conduction contact area between the chassis cold wall and the frame is increased in width from approximately 0.25" to approximately 0.35". In either embodiment, the wedgelock is mounted to one surface of the frame such that when installed in a conduction-cooled chassis, the opposite frame surface is forced against the chassis cold wall. In addition, the wedgelock can be enlarged to increase the clamping force (i.e., pressure) over the contact area between the chassis cold wall and the frame. The increased wedgelock size approximately doubles the clamping force applied with respect to conventional modules. The net effect of these improvements are a reduction in the thermal resistance per inch of wedgelock length from, for example, approximately 2° C.-in/W to approximately 1° C.-in/W. This, in turn, reduces the module to chassis interface temperature rise of a typical 40 W module from, for example, about 8.3° C. to about 4.15° C. The improved thermal resistances and decreased temperature rises boost the reliability of the circuit cards as compared to the prior art, particularly in the stringent environments experienced in military applications.

The novel features of the present invention will become apparent to those of skill in the art upon examination of the following detailed description of the invention or can be learned by practice of the present invention. It should be understood, however, that the detailed description of the invention and the specific examples presented, while indicating certain embodiments of the present invention, are provided for illustration purposes only because various changes and modifications within the spirit and scope of the invention will become apparent to those of skill in the art from the detailed description of the invention and claims that follow.

IV. BRIEF DESCRIPTION OF THE DRAWINGS

The accompanying figures, in which like reference numerals refer to identical or functionally-similar elements throughout the separate views and which are incorporated in and form part of the specification, further illustrate the present invention and, together with the detailed description of the invention, serve to explain the principles of the present invention.

V. DETAILED DESCRIPTION OF THE INVENTION

Figure 1:
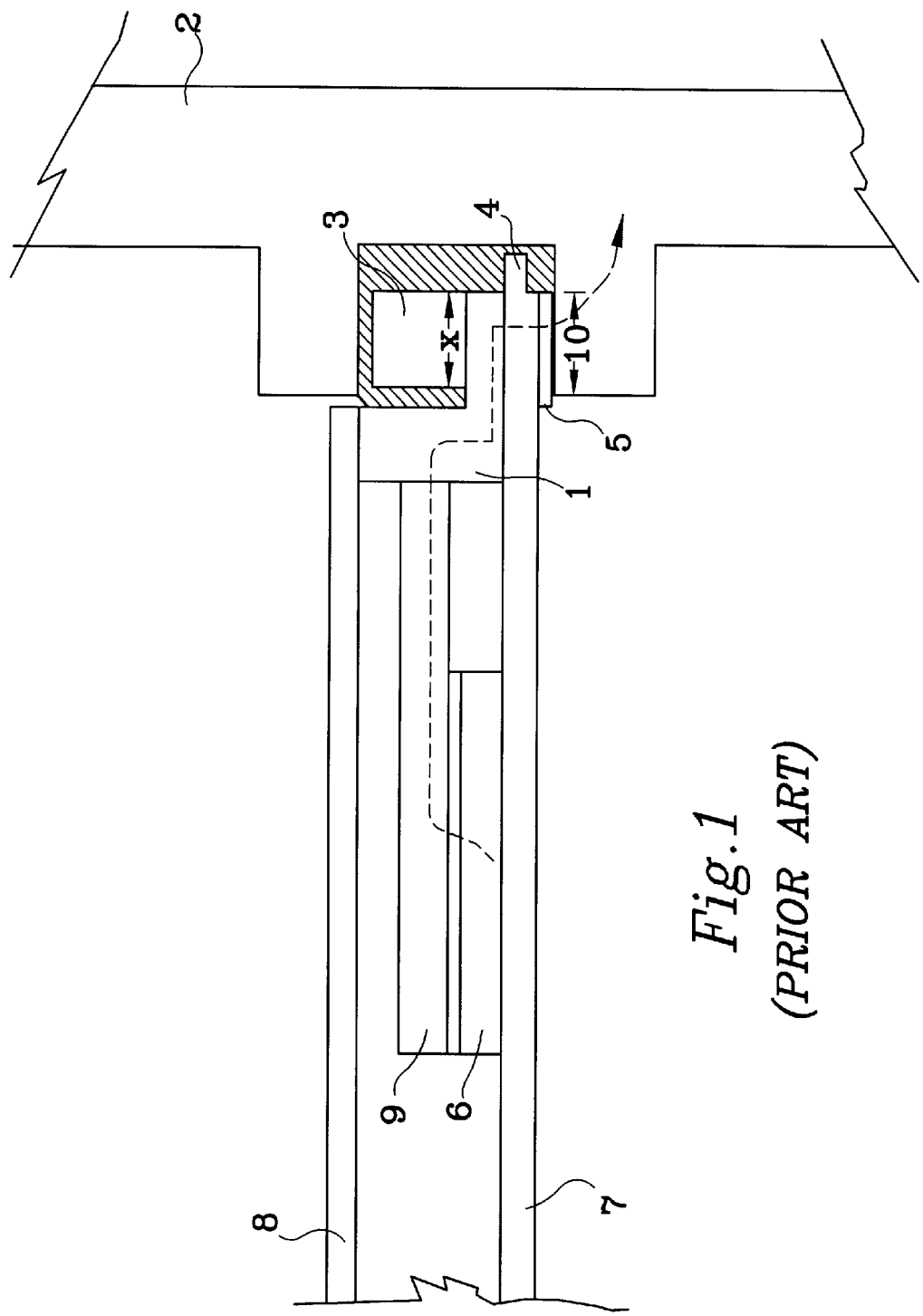
FIG. 1 illustrates a cross-sectional view of a prior art circuit card module installed in a conduction-cooled chassis (fully compliant with IEEE 1101.2 Specifications).

Referring to FIG. 1, there is shown a cross-sectional view (top or side view) of a conventional circuit card module design installed in a conduction cooled chassis 2. The module of FIG. 1 comprises two circuit cards: a mezzanine card 8 and a base card 7 although the number and type of cards can vary. A plurality of electrical components 6 (e.g., integrated circuits, high-power die-up devices, etc.) are mounted (e.g., soldered, ball grid array, etc.) on circuit cards 7 and 8, although FIG. 1 illustrates component 6 mounted on card 7 only. Component 6 generates heat during its normal operation, and two thermal paths for heat removal are provided. The first thermal path is through the lower surface of component 6 to the end of circuit card 7 to chassis cold wall 2 via metal strip 5 (or shim). The metal strip 5 acts both as a heatsink and as protection for the card 7 against damage when it is inserted and removed from the chassis 2. The other thermal path for component 6 (shown by the dotted arrow in FIG. 1), and the primary one of interest, is through the top surface of component 6 to thermally-conductive heatsink 9 to module frame 1 and to chassis cold wall 2 via card 7 and metal strip 5. Optionally, heatsink 9 and frame 1 can be constructed from one piece of material. The heat efficiency of this thermal path is directly affected by the clamping force exerted by wedgelock 3 (i.e., the higher the pressure, the lower the thermal resistance) and the contact area 10 between the cold wall chassis and the card 7 or strip 5 depending upon the configuration (i.e., strip 5 may not always be present). An end portion of the circuit card 7 often includes a protrusion 4 (often machined from base card 7), which allows this module to be compliant with a convection-cooled chassis as defined in IEEE 1101.2 Specifications (see, e.g., FIG. 3 for a conventional 1101.2 compliant module used in a convection-cooled chassis). The problematic thermal resistances in the module of FIG. 1 include the resistance between the metal strip 5 and the chassis cold wall 2 (e.g., about 0.23 C/W), between the metal strip 5 and the card 7 (e.g., about 0.3 C/W), and between the card 7 and the frame 1 (e.g., about 0.11 C/W). The hatch marks in FIG. 1 represent air gaps. The module of FIG. 1 fails to use approximately 40% of the cold wall of chassis 2 surface contact area available for thermal conduction; it uses only the surface contact area 10 for thermal conduction, which is typically about 0.25" in width. Additionally, for IEEE 1101.2 purposes, the module must be compliant with the convection-cooled chassis (see, e.g., FIG. 3) so it typically includes the protrusion 4.

Figure 2:
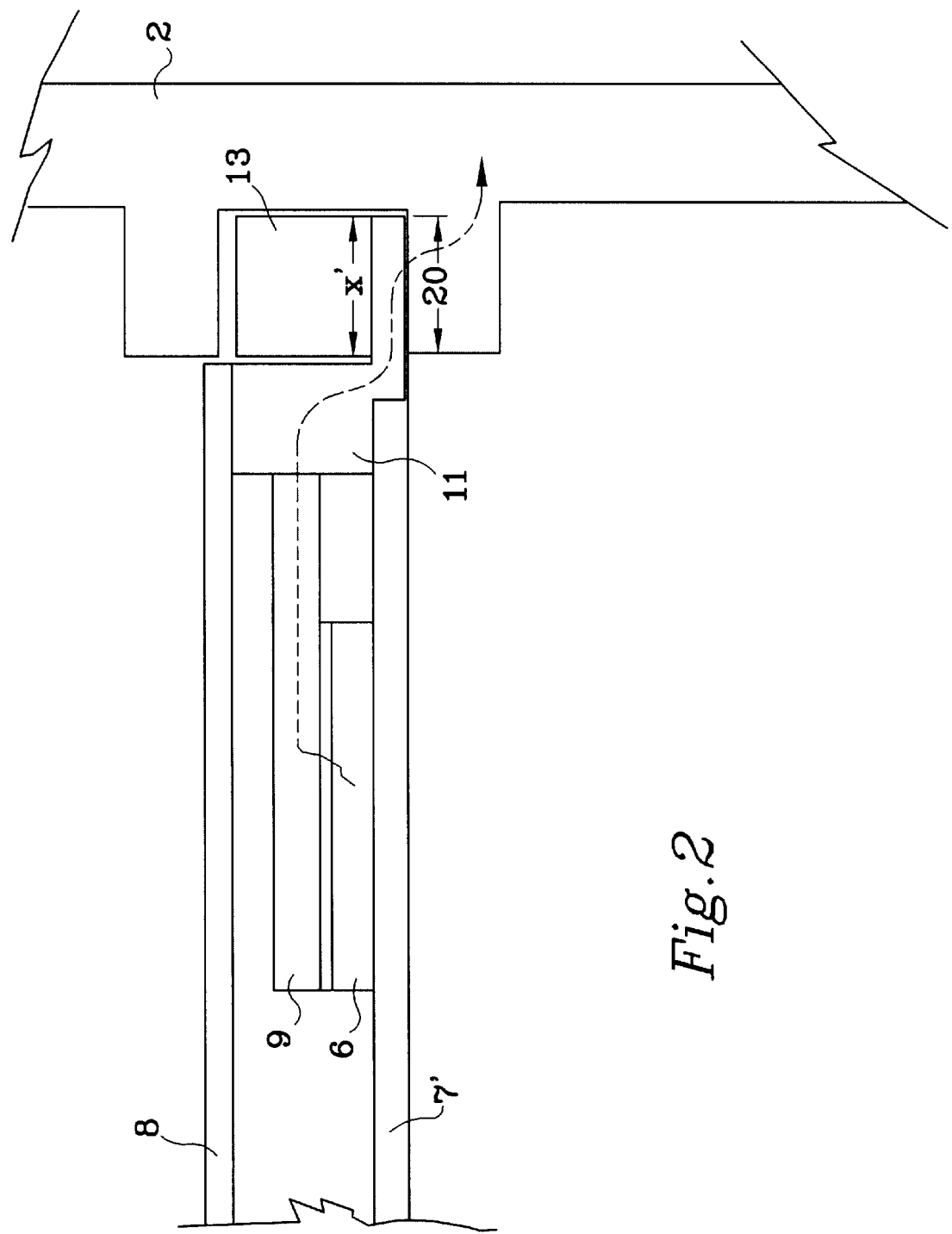
FIG. 2 illustrates a cross-sectional view of an embodiment of the present invention installed in a conduction-cooled chassis (partially compliant with IEEE 1101.2 Specifications).

In contrast, the module illustrated in FIG. 2, an embodiment of the present invention, has improved cooling efficiency when used in a conduction-cooled chassis 2. The improved cooling efficiency is achieved, at least in part, through the use of a larger wedgelock 13. In the embodiment of FIG. 2, the wedgelock 3 of FIG. 1 is increased in width from x to x', e.g., from about 0.25" to about 0.35". The increased width x' of the wedgelock 13 identically increases the contact area 20 between the frame 11 and the chassis cold wall 2. A second important result of the alteration or augmentation is that the frame 11 (a restructured frame 1 of FIG. 1) is in direct contact with chassis 2, which results in a more direct thermal path. The card 7' is either the same card 7 of FIG. 1 pulled back to allow for the placement of frame 11 or a modified/shortened version of card 7 with the protrusion 4 removed. The restructuring results in a frame 11 that optionally eliminates the protrusion 4 of FIG. 1 necessary for use with convection-cooled chassis (but not necessary in a conduction-cooled chassis) or optionally maintains the protrusion as in FIGS. 4 and 5. Further, the frame 11 eliminates the need for the metal strip 5 of FIG. 1. It should be noted that a reduction and simplification in thermal resistances is realized in the embodiment illustrated in FIG. 2, where it is reduced to 0.1 C/W between the frame 11 and chassis 2 cold wall. In summary, the larger surface contact area between the frame 11 and chassis 2 cold wall as well as the additional clamping force from the larger wedgelock 13 results in overall lower component running temperatures for this embodiment. The embodiment of FIG. 2 is partially compliant with the IEEE 1101.2 Specifications as it does not include a protrusion for use in a convection-cooled chassis. Embodiments having frames that maintain the protrusion and still use a larger wedgelock for increased cooling efficiency are also contemplated, and are discussed below with respect to FIGS. 4 and 5.

A commercially-available wedgelock 13 suitable for use in the present invention is the Card-Lok product which can be obtained from Calmark Corp., San Gabriel, CA. In particular, the frame structures 11 and 21 of the present invention are designed to allow the use of large wedgelocks, e.g., those utilizing larger screws such as 6-32, 8-32, or 10-32 size screws. As described above, the removal of the protrusion 4 allows for an increase in the width of the contact surface between the frame 1 and chassis 2 by from about 0.25" to about 0.35". Not only is there an increase in the surface areas 20 and 30 (with respect to surface contact area 10) that is in contact with the other parts of the circuit card module, but the larger wedgelock 13 exerts greater force between the frame 11 or 21 to the chassis cold wall 2 than the smaller wedgelock 3 of the prior art. As clamping force is increased, the interface conductance is increased, thus increasing the efficiency of heat movement from the component 6 to the cold wall of chassis 2. Optionally, the clamping force can be further increased by using a wedgelock 13 that has a friction-reducing finish applied to it and by installing the wedgelock 13 with washers. Wedgelocks made of aluminum are preferred, although other materials can be used.

The increased force, in combination with the additional contacting surface areas, significantly reduces the thermal resistance between the frame and the chassis 2 cold wall. In particular, typical thermal resistances across the wedgelock of conduction-cooled VME 6U modules is about 2° C. in/W. Thus, with an approximately 40 Watt (W) module, for example, there is an average 8.3° C. temperature rise. This temperature rise is significantly avoided using the adapter of the present invention. The reduction of thermal resistances and temperature rises is reflected in a reduced running temperature for component 6.

Figure 3:
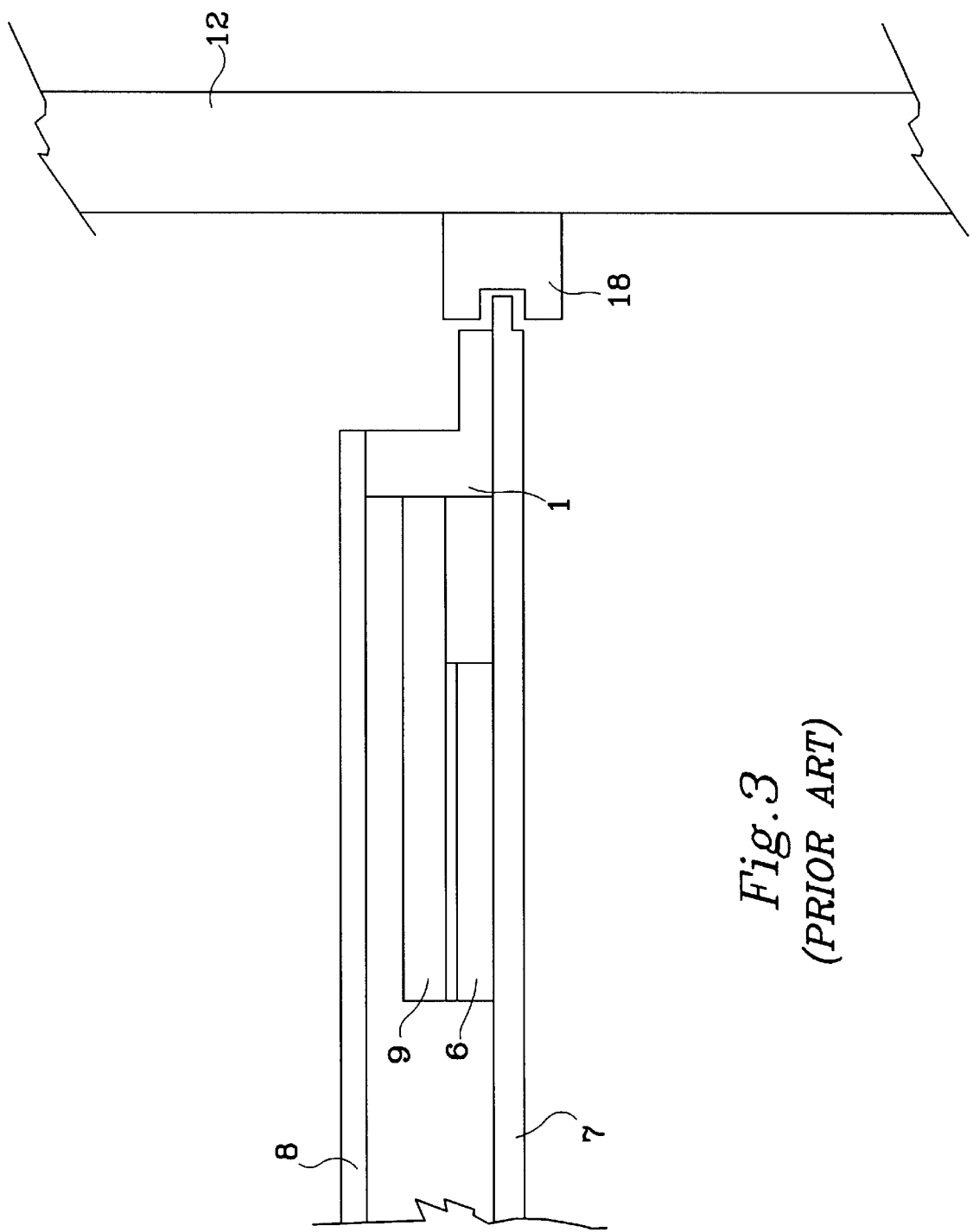
FIG. 3 illustrates a cross-sectional view of a prior art circuit card module installed in a convection-cooled chassis (fully compliant with IEEE 1101.2 Specifications).

Referring to FIG. 3, there is shown a prior art circuit card module that is compliant with the IEEE 1101.2 Specifications and is installed in a convection-cooled chassis 12. A card guide 18 is attached to the convection-cooled chassis 12 with for example, screws, for receiving the card 7 by its protrusion 4. In a conduction-cooled chassis, on the other hand, the channel for receiving the protrusion 4 is machined into the chassis 2 itself as shown in FIGS. 1, 2, 5, and 6. The remaining structure of the circuit card module in FIG. 3 is similar to that discussed above with respect to FIG. 1 (similar reference numerals indicate similar components), with the exclusion of wedgelock 3 and strip 5 which are not present in convection-cooled applications, and need not be discussed again as its structure will be apparent to those skilled in the art. In a convection-cooled chassis as shown in FIG. 3, airflow, for example, over the circuit card module removes the heat to the ambient environment.

Figure 4:
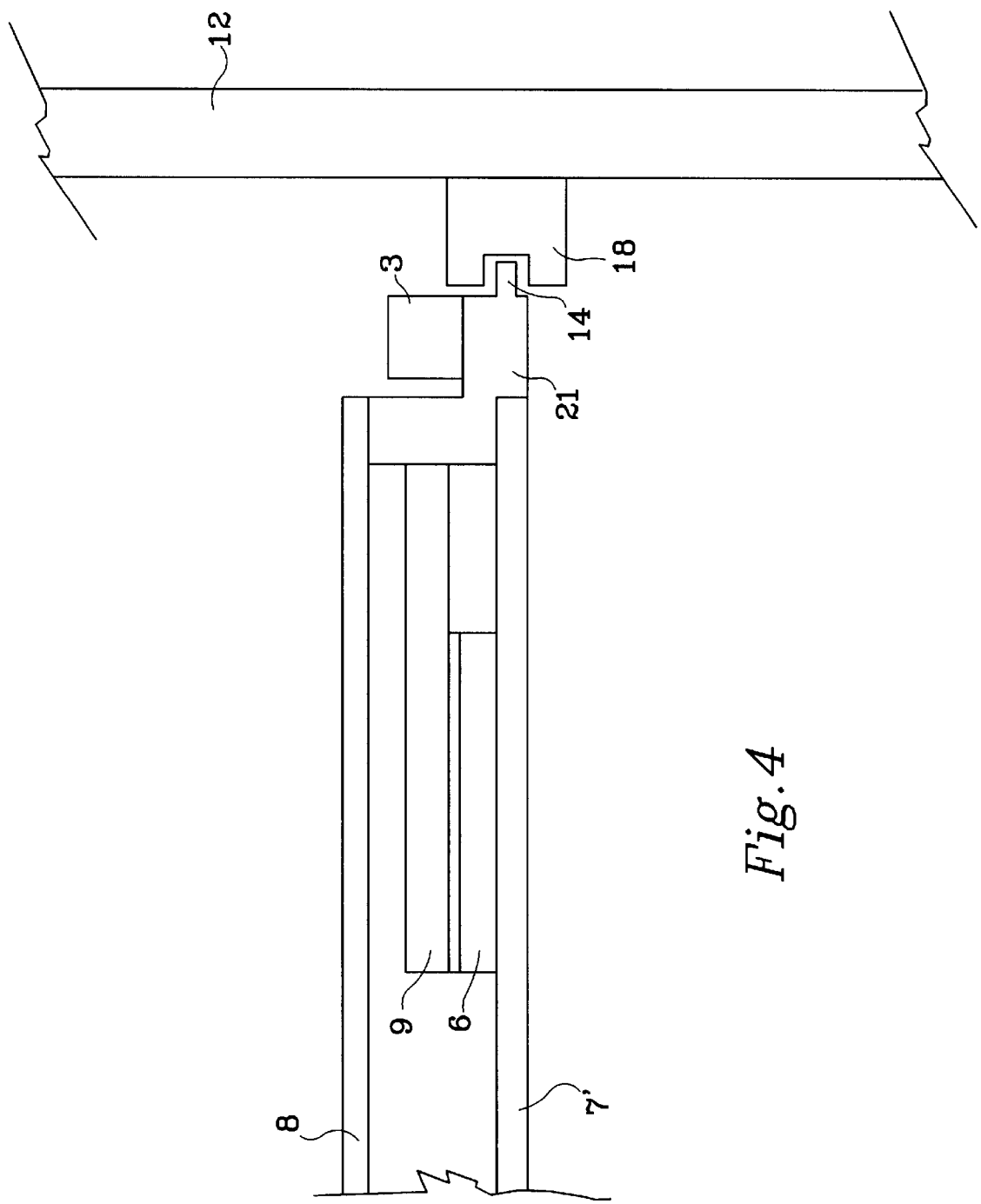
FIG. 4 illustrates a cross-sectional view of an alternate embodiment of the present invention installed in a convection-cooled chassis (fully compliant with IEEE 1101.2 Specifications).

Referring to FIG. 4, there is shown an alternate embodiment of the present invention installed in a convection-cooled chassis 12. The circuit card module comprises a frame 21, which includes a protrusion 14 that fits in the card guide 18 of the chassis 12 as shown. Although the wedgelock 3 would most likely be used in practice, a larger wedgelock can also be used in this alternate embodiment. The frame 21 allows for a larger wedgelock to be used and for the strip 5 to be eliminated. The remaining structure of the circuit card module in FIG. 4 is similar to that discussed above with respect to FIG. 2 (similar reference numerals indicate similar components) and need not be discussed again as its structure will be apparent to those skilled in the art. However, in the event that the circuit card module is to be used in commercial (non-military) applications and convection cooled, then the wedgelock 3 would not be present. It is contemplated, however, that certain convection-cooled applications would require the use of the wedgelock 3 and thus, it is shown for purposes of illustration. For example, if the circuit card modules are integrated (first tested) in a commercial, convection-cooled chassis in a laboratory environment and then installed into the actual chassis, then the wedgelock 13 would be used.

Figure 5:
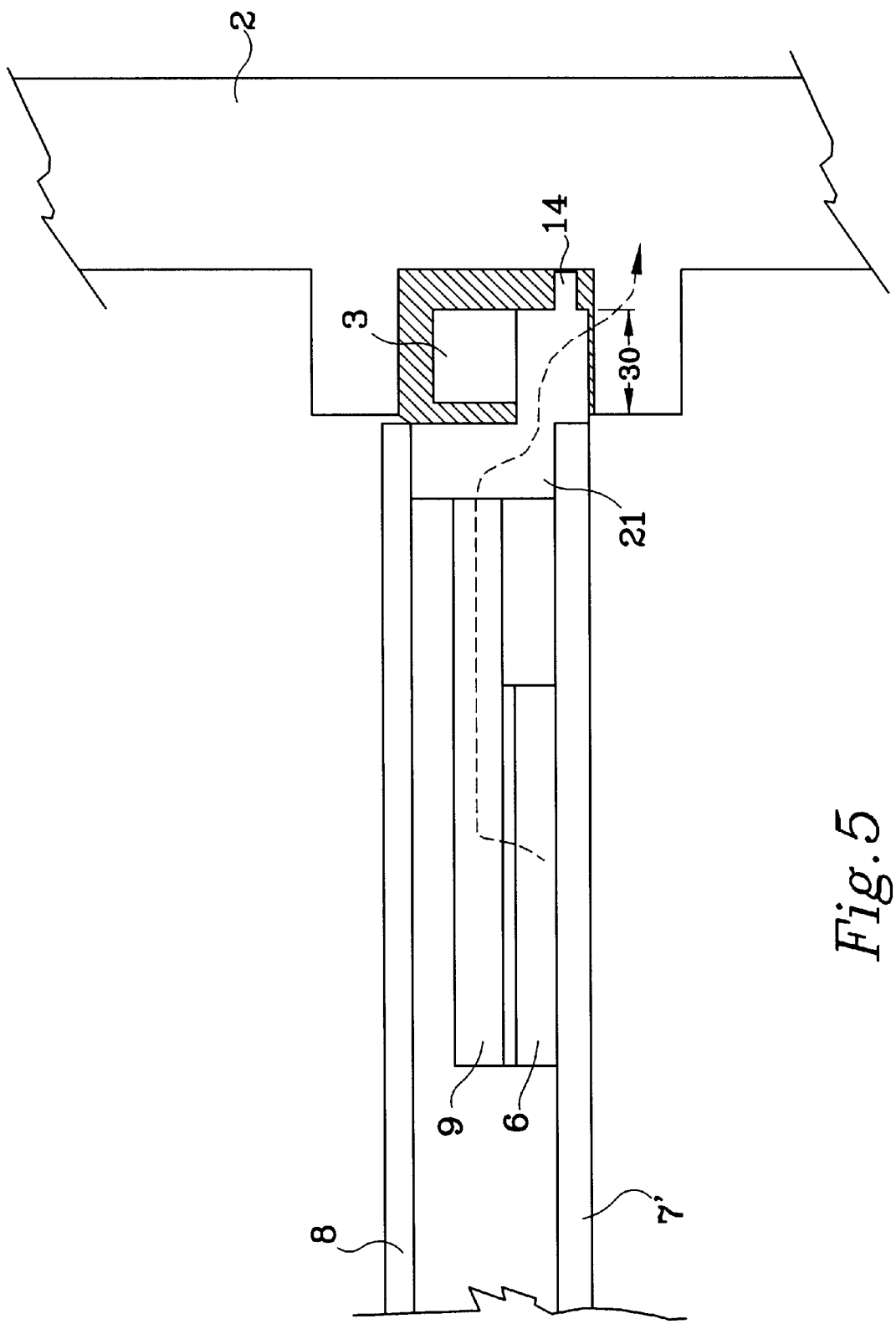
FIG. 5 illustrates a cross-sectional view of the alternate embodiment of the present invention installed in a conduction-cooled chassis (fully compliant with IEEE 1101.2 Specifications).

Referring to FIG. 5, there is shown the embodiment as illustrated in FIG. 4 except that the circuit card module is mounted in a conduction-cooled chassis 2. This embodiment has a protrusion 14 and thus, is compliant with the IEEE 1101.2 Specifications. Similar to the embodiment of FIG. 2, the embodiment of FIG. 5 has increased cooling efficiency but remains compatible with a convection-cooled chassis 12. In the embodiment of FIG. 5, however, the surface contact area 30 is not as large as the surface contact area 20 in FIG. 2. Also similar to the embodiment of FIG. 2, a reduction and simplification in thermal resistances is realized in the embodiments illustrated in FIG. 5, where it is reduced to only between the frame 21 and chassis cold wall 2 (strip 5 is eliminated). In any event, an extended width wedgelock allows for greater surface contact area 30 to improve the thermal performance.

The reduction of thermal resistances and temperature rises is reflected in a reduced running temperature for component 6. Predictions using standard thermal analysis software were preformed to measure the expected improvements with the various embodiments of the present invention. The analysis showed that the conventional design, as illustrated in FIG. 1, had a component running temperature of about 980° C. The embodiment illustrated in FIG. 5 (i.e., design with the frame 21 that includes the protrusion 14) had a component running temperature of 90.6° C. The embodiment illustrated in FIG. 5 has an improvement over the conventional design of FIG. 1 of about 7.4° C. Finally, the maximized design embodiment, illustrated in FIG. 2, had a component running temperature of about 86.8° C., a full 11.2° C. improvement over the conventional design shown in FIG. 1. Such a reduction in running temperatures significantly increases the reliability of the circuit card module, particularly when subjected to the environmental temperatures present when the cards are used in military applications.

An additional manner in which to analyze the increased ability of the present invention to dissipate heat is to examine the difference in the temperature rise from the base 71° C. chassis to the component junction. The conventional design of FIG. 1 has a temperature rise of about 27° C. In contrast, the embodiment of FIG. 4 has a temperature rise of about 19.6° C., which is an improvement of 27.4% over the conventional design of FIG. 1. The embodiment of FIG. 2 has a temperature rise of about 15.8° C., which is an improvement of about 41.5% over the conventional design of FIG. 1. This analysis demonstrates the ability of the present invention to more effectively and dramatically transfer heat from the component 6 of a circuit card to the chassis 2 cold wall.

Figure 6:
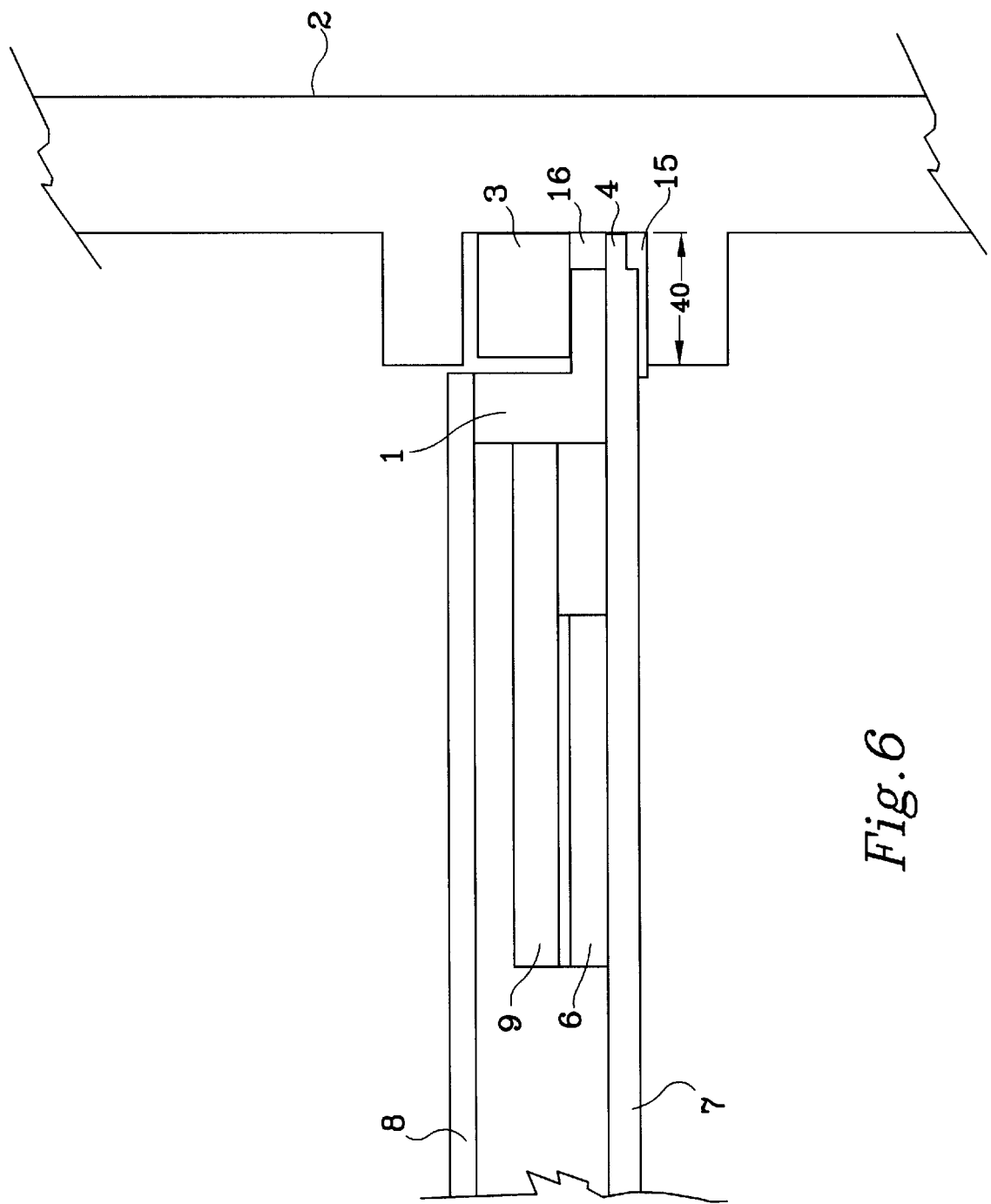
FIG. 6 illustrates a cross-sectional view of a commercially-available circuit card module modified with an adapter to increase thermal efficiency.

Referring to FIG. 6, there is shown a cross-sectional view of a commercial off-the-shelf (COTS) circuit card module modified with the adapter of the present invention to increase thermal efficiency using the principles described above (i.e., greater pressure from an extended width wedgelock, increased surface contact area 40, and extended frame to increase the conduction contact area). The circuit card module of FIG. 6 does not necessarily have to be compliant with the IEEE 1101.2 Specifications and can be any commercially-available circuit card. Many of the COTS conduction-cooled VME circuit card modules suffer from the thermal problems described above. The adapter of the present invention shown in FIG. 6 allows COTS circuit card modules to obtain the improved thermal performance and be in compliance with IEEE 1101.2 Specifications when used in a conduction-cooled chassis. The premise behind the design of FIG. 6 is to provide a wedgelock/chassis interface modification kit to existing modules to increase the cold wall contact area for improved cooling efficiency without a complete redesign of the PWB mechanical interface. The adapter requires the removal of the COTS backside abrasion strip (strip 5 in FIG. 1), and potentially replacement of wedgelock 3 with an extended width wedgelock. These items are replaced with the adapter to increase the surface area contract between the cold wall of the chassis and the strip in contact with card 7 without impacting the COTS design. Once adapted, however, the COTS module is not backwards compatible with the convection-cooled type racks. As can be seen from FIG. 6, elements 3 (which can have an extended width), 16 and 15 combine to increase the conduction contact between the COTS circuit card module and the cold wall of the chassis 2.

In the circuit card module of FIG. 6, the strip 15 (an element of the adapter) fully cooperates with the bottom surface of the card 7 and its protrusion 4 for an increased surface contact area 40, i.e., the air gaps of FIG. 1 (shown by hatch marks) between the chassis cold wall, the card 7, and the strip 5 are substantially filled by the adapter. The frame 1 is either adapted with another piece of material extension 16 to extend up to the chassis 2 cold wall or is constructed of one piece (frame 1 integrated with extension 16). The adapter allows the COTS circuit card module to fully utilize the surface contact area 40 between the underside of card 7 and the chassis 2 cold wall, and optionally, the contact area between the wedgelock and frame 1 with extension 16. Thus, the surface contact area between the circuit card module is increased and the thermal performance improved without impacting the existing COTS design. Also, the wedgelock 3 can be an extended width wedgelock as described above with respect to FIGS. 2, 4, and 5 to further increase the contact area with the frame 1 and extension 16. Comparing the COTS card module of FIG. 1 with that of FIG. 6, it can be seen that the air gaps (shown by hatch marks in FIG. 1) have been substantially filled by the adapter (i.e., elements 15 and 16). In particular, the frame 1 is extended with extension 16 to utilize the contact area 40, the width of wedgelock 3 can be extended, and the strip 15 fully utilizes the space under the protrusion 4. The configuration of FIG. 6 significantly reduces the thermal resistance between card 7, strip 15, and chassis 2 cold wall, which reduces the overall junction temperature of the components resulting in improved module reliability.

Other variations and modifications of the present invention will be apparent to those of skill in the art, and it is the intent of the appended claims that such variations and modifications be covered. The particular values and configurations discussed above can be varied and are cited merely to illustrate a particular embodiment of the present invention and are not intended to limit the scope of the invention. It is contemplated that the use of the present invention can involve components having different characteristics as long as the principle is followed, i.e., the presentation of an interchangeable stiffening frame for improving the thermal efficiency of circuit card module that can be either IEEE 1101.2 compliant (including rib guide) or an interchangeable stiffening frame without a rib guide allowing for a larger surface area contact between the chassis and the frame and increased pressure from the extended width wedgelock. It is intended that the scope of the present invention be defined by the claims appended hereto.

The embodiments of an invention in which an exclusive property or right is claimed are defined as follows:

1. A VME circuit card module, said circuit card module being mounted in a conduction cooled chassis and being mechanically compatible with a convection cooled chassis and having an increased conduction cooling efficiency, the conduction cooled chassis having at least one card guide slot, the circuit card module comprising:

at least one base card;

at least one mezzanine card proximate to said base card;

at least one component mounted on said base card and at least one component mounted on said mezzanine card, each of the at least one components having on its surface a heatsink;

a heat path between each at least one component and the conduction cooled chassis;

an interchangeable frame supporting the base card and the mezzanine card, wherein said frame comprises a conduction cooling frame in direct contact with the conduction cooled chassis and wherein an edge end of said conduction cooling frame directly contacts a guide slot wall of immediately juxtaposed with the conduction cooled chassis; and a wedgelock mounted on said conduction cooling frame that secures said conduction cooling frame to the conduction cooled chassis guide slot via pressure, wherein said wedgelock and a predetermined portion of said conduction cooling frame fill nearly all of the an entire area of the at least one card guide slot, wherein each heatsink and said base card and said mezzanine card are in direct contact with said conduction cooling frame, wherein said conduction cooling frame is also in direct contact with said wedgelock and the conduction cooled chassis.

2. The circuit card module of claim 1 wherein an edge of said wedgelock is immediately juxtaposed with the conduction cooled chassis.

3. The circuit card module of claim 1 wherein an edge of said wedgelock is immediately juxtaposed with the conduction cooled chassis.

4. The circuit card module of claim 1, wherein said conduction cooling frame comprises one piece.

5. The circuit card module of claim 1, wherein said conduction cooling frame comprises two pieces.

* * * * *